(12) United States Patent
Matsuura et al.

(10) Patent No.: US 7,977,874 B2
(45) Date of Patent: Jul. 12, 2011

(54) ORGANIC EL DISPLAY DEVICE COMPRISING A REFLECTION STRUCTURE

(75) Inventors: Toshiyuki Matsuura, Mobara (JP); Masahiro Tanaka, Chiba (JP); Masato Ito, Mobara (JP)

(73) Assignee: Hitachi Displays, Ltd., Chiba-ken (JP)

( * ) Notice: Subject to any disclaimer, the term of this patent is extended or adjusted under 35 U.S.C. 154(b) by 321 days.

(21) Appl. No.: 12/230,416

(22) Filed: Aug. 28, 2008

(65) Prior Publication Data
US 2009/0058290 A1 Mar. 5, 2009

(30) Foreign Application Priority Data
Aug. 29, 2007 (JP) .................................. 2007-222019

(51) Int. Cl.
*H01L 51/50* (2006.01)
*H01L 51/52* (2006.01)
*H01L 51/54* (2006.01)

(52) U.S. Cl. ......... 313/506; 313/503; 313/504; 313/509

(58) Field of Classification Search .......... 313/498–512; 315/169.1, 169.3; 257/40, 72, 98–100, 642–643, 257/759
See application file for complete search history.

(56) References Cited

U.S. PATENT DOCUMENTS

| 7,166,959 | B2 * | 1/2007 | Suzuki et al. | 313/504 |
| 7,777,406 | B2 * | 8/2010 | Son | 313/503 |
| 2003/0234608 | A1 * | 12/2003 | Lee et al. | 313/504 |
| 2004/0256979 | A1 * | 12/2004 | Murakami et al. | 313/503 |
| 2005/0224789 | A1 | 10/2005 | Seo et al. | |
| 2005/0230684 | A1 * | 10/2005 | Seo et al. | 257/72 |

FOREIGN PATENT DOCUMENTS
JP 2005-222759 2/2004
* cited by examiner

*Primary Examiner* — Nimeshkumar D Patel
*Assistant Examiner* — Jose M Diaz
(74) *Attorney, Agent, or Firm* — Stites & Harbison PLLC; Juan Carlos A. Marquez, Esq.

(57) ABSTRACT

The present invention provides an organic EL display device which has a long lifetime. The organic EL display device includes a plurality of pixels each of which is constituted of a top-emission-type active matrix organic EL element. The EL element includes: a pixel electrode; a reflective layer arranged between the pixel electrode and an active element and is formed over a leveling layer; an organic light emission layer; and a common electrode. The reflective layer includes: a first reflective layer which is made of high-melting-point metal; and a second reflective layer which is arranged on the first reflective layer. The second reflective layer includes a planar pattern in which an outer periphery of the second reflective layer is surrounded by the first reflective layer. The pixel electrode extends outward from the first reflective layer and the second reflective layer.

5 Claims, 1 Drawing Sheet

ORGANIC EL DISPLAY DEVICE COMPRISING A REFLECTION STRUCTURE

CLAIM OF PRIORITY

The present application claims priority from Japanese Application JP2007-222019 filed on Aug. 29, 2007, the content of which is hereby incorporated by reference into this application.

BACKGROUND OF THE INVENTION

The present invention relates to an organic EL (electroluminescent) display device, and more particularly to the reflection structure of a top-emission-type active matrix organic EL display device.

The reflection structure of a conventional top-emission-type active matrix organic EL display device is disclosed in JP-A-2005-222759 (patent document 1).

The patent document 1 discloses that it is preferable to insert a layer made of a Mo-based material to improve adhesiveness between Al and a leveling film.

SUMMARY OF THE INVENTION

Inventors of the present invention come up with an idea of separating a function of a pixel electrode and a function of a reflection plate. To assign priority to reflectance, it is desirable to adopt an Al-based material (Al, Al alloy, AlSi or the like) as a material of the reflection member. However, as disclosed in patent document 1, when the Al-based material is used, the collective etching of the reflective member with the pixel electrode ITO is difficult. Further, in forming an ITO film after the formation of the Al-based-material film, an alumina film having high resistance is formed on an interface. Accordingly, it is difficult to control an electric current which flows in the ITO film via the alumina film having high resistance.

In view of the above, the inventors of the present invention come up with an idea to form a reflective film using AlSi and to form a pixel electrode using ITO on the reflective film.

However, there arises a drawback that the adhesiveness between AlSi and the leveling film is found to be poor. In an attempt to overcome this drawback, the inventors of the present invention inserts MoW which is Mo-based alloy as disclosed in patent document 1.

By adopting the AlSi/MoW stacked structure, the adhesiveness between AlSi and the leveling film can be enhanced. However, since thicknesses, sizes, etching conditions and the like of the AlSi/MoW layers are not taken into consideration, there still is a case in which a lifetime of light emitting elements is shortened due to a gas discharged from the leveling layer.

Accordingly, it is an object of the present invention to provide an organic EL display device having a long lifetime by making the display device hardly influenced by a gas discharged from an organic leveling layer.

To overcome the above-mentioned drawback, the present invention provides an organic EL display device which includes a plurality of pixels each of which is constituted of a top-emission-type active matrix organic EL element. Here, the top-emission-type active matrix organic EL element includes: a pixel electrode which is connected to an active element; a reflective layer arranged between the pixel electrode and an active element and is formed over a leveling layer; an organic light emission layer which is arranged on the pixel electrode; and a common electrode which is arranged on the organic light emission layer. The reflective layer includes: a first reflective layer which is made of high-melting-point metal; and a second reflective layer which is arranged on the first reflective layer and is made of alloy containing aluminum, an aluminum compound or aluminum silicide. The second reflective layer includes a planer pattern in which an outer periphery of the second reflective layer is surrounded by the first reflective layer. The pixel electrode covers the second reflective layer.

By forming the first reflective layer which constitutes the lower layer using the high-melting-point metal which exhibits high adhesiveness, it is possible to improve the adhesiveness on an interface between the first reflective layer and the leveling film which constitutes a background layer. Further, since the second reflective layer is formed in a pattern in which the second reflective layer is embraced in the first reflective layer, it is possible to directly cover an upper surface and side surfaces of the second reflective layer with the pixel electrode. Due to such constitution, a path along which a gas discharged from the leveling film intrudes into a reflective surface of the reflective layer can be blocked and hence, a lifetime of the display device can be prolonged.

By forming the edges of the second reflective layer in a forwardly tapered shape, the formation of the pixel electrode on the second reflective layer by sputtering can be enhanced thus enhancing the adhesiveness whereby the lifetime of the display device can be further prolonged.

The second reflective layer may be formed using Al-based alloy. In this case, the first reflective layer may preferably made of Mo alloy or W alloy.

Further, by adopting the structure in which not only the second reflective layer but also the first reflective layer are covered with the pixel electrode made of ITO, or the structure in which the edges of the first reflective layer, the second reflective layer and the pixel electrodes are covered with the pixel separation layer, it is possible to further effectively suppress the discharge of a gas from the leveling film.

According to the present invention, it is possible to provide the organic EL display device which has a long lifetime.

DESCRIPTION OF THE PREFERRED EMBODIMENTS

Figure 1:
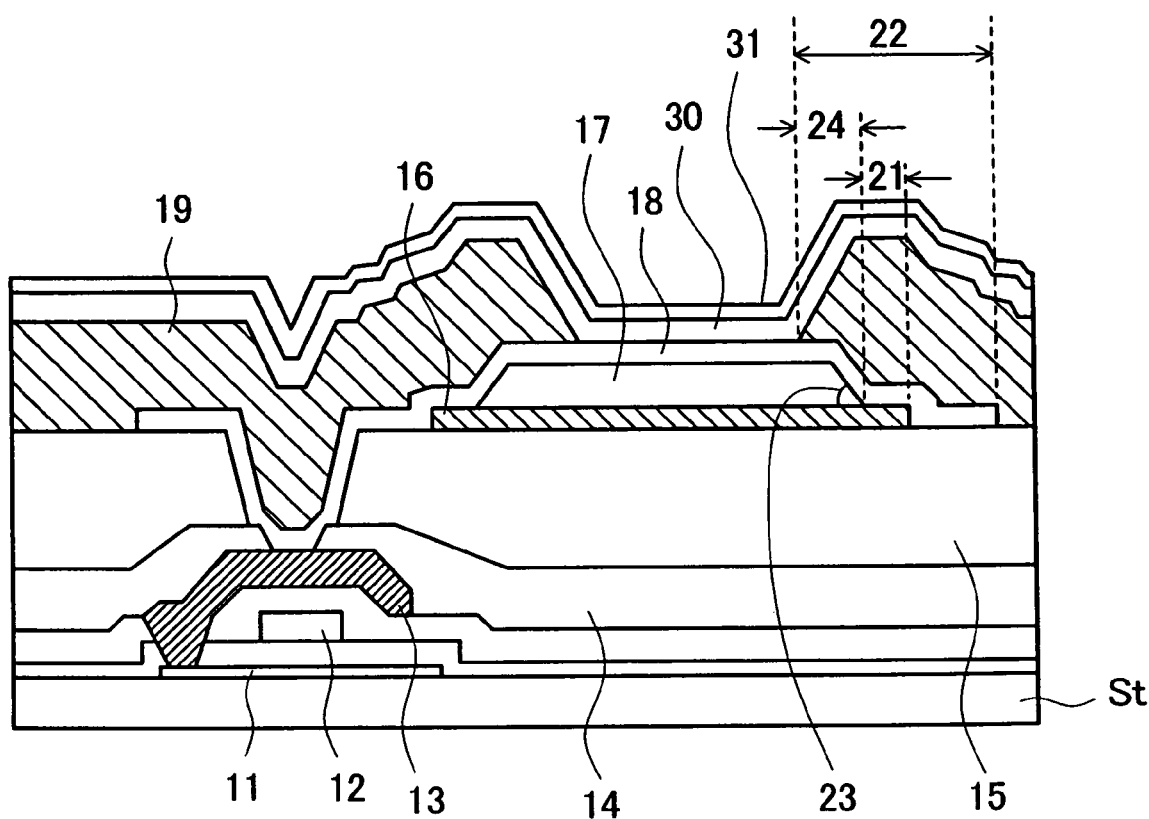
FIG. 1 is a view showing the cross-sectional structure of an organic EL display device.

Hereinafter, an organic EL display device according to an embodiment of the present invention is explained.

Embodiment

FIG. 1 shows the cross-sectional structure of an organic EL display device to which the present invention is applied.

The organic EL display device to which the present invention is applied includes an active element TFT substrate St, organic light emission layers 30 formed on the TFT substrate, and a transparent common electrode 31 formed on the organic light emission layers 30.

On the TFT substrate St, semiconductor layers 11 which form channels, gate lines 12, source and drain electrodes 13, a protective layer 14, a leveling layer 15, first reflective layers 16, second reflective layers 17, pixel electrodes 18, a pixel separation layer 19 which cover edges of the reflective layers and the pixel electrodes are formed.

The leveling layer 15 has a function of alleviating stepped portions formed by lines (gate lines 12, source and drain electrodes 13 and the like) arranged below the leveling layer 15. The leveling layer 15 is also provided for enhancing flatness of the first reflective layers 16, the second reflective layers 17 and the pixel electrodes 18 arranged on the leveling layer 15.

Although the leveling layer 15 is preferably formed using polyimide or acryl as a material thereof by a coating method, the leveling layer 15 may be formed of a stacked film consisting of such a film and a SiO or SiN film by a CVD method.

The first reflective layer 16 is a layer which is formed between the leveling layer 15 and the second reflective layer 17 for improving the adhesiveness between the leveling layer 15 and the second reflective layer 17. The first reflective layer 16 also performs a function of suppressing the lowering of reflectance of the second reflective layer 17 attributed to a gas discharged from the leveling layer 15. For this end, to prevent the direct contact between the second reflective layer 17 and the leveling layer 15, the second reflective layer 17 is formed in a region where the second reflective layer 17 is embraced in the first reflective layer 16. A size of a gap 21 between an edge of the first reflective layer 16 and an edge of the second reflective layer 17 may preferably be 10 nm or more. Further, due to the above-mentioned function of the first reflective layer 16, the first reflective layer 16 may preferably be made of Mo, W, Ta, Ti or a compound made of Mo, W, Ta and Ti. Particularly, when the second reflective layer 17 is formed using an Al-based material (Al alloy, AlSi or the like), with the use of Mo, W or the compound made of Mo and W as the material of the first reflective layer 16, the second reflective layer 17 and the first reflective layer 16 can be collectively etched by wet etching thus facilitating the manufacture of the organic EL display device.

The second reflective layer 17 may preferably be made of a material which can ensure reflectance of 80% or more in a visible light region, and Ag, Al or a compound of Ag and Al may be used as the material of the second reflective layer 17. To allow the second reflective layer 17 to ensure the reflection, the second reflective layer 17 is required to have a layer thickness of 100 nm or more. From a viewpoint of facilitating the later formation of the pixel separation layer, the layer thickness of the second reflective layer 17 may preferably be set to 400 nm or less. Further, by selecting an Al-based material as a material of the second reflective layer 17, the second reflective layer 17 can be collectively etched with the first reflective layer 16 thus facilitating the manufacture of the organic EL display device.

The second reflective layer 17 and the first reflective layer 16 may be collectively formed by wet etching using an Al based material as the material of the second reflective layer 17 and an Mo-based material as the material of the first reflective layer 16. In this case, by setting a ratio between a layer thickness T2 of the second reflective layer 17 and the layer thickness T1 of the first reflective layer 16 (T2/T1) to 2 or more, after the formation of these layers, the edge of the first reflective layer 16 is arranged outside the edge of the second reflective layer 17. That is, a pattern of the second reflective layer 17 is provided inside a pattern of the first reflective layer 16.

The pixel electrode 18 may preferably be made of a material which exhibits high visible light transmissivity and a high work function and hence, the pixel electrode 18 may be formed into a film using ITO, IZO, MoO3, ZnO or the like by sputtering. However, since the pixel electrode 18 exhibits the high work function, in forming the pixel electrode 18, the second reflective layer 17 may be corroded due to the difference in work function between the pixel electrode 18 and the second reflective layer 17. Accordingly, the pixel electrode 18 is formed by patterning such that the pixel electrode 18 covers the whole surface of the second reflective layer 17 thus protecting the second reflective layer 17. In this case, a size of a gap between the edge of the first reflective layer 16 and an edge of the pixel electrode 18 (size 22-size 24-size 21) may preferably be set to 0.5 µm or more. To prevent the second reflective layer 17 from being corroded in forming the pixel electrode 18, end portions of the second reflective layer 17 are forwardly tapered. It is particularly preferable to set a taper angle 23 to 30 degrees to 89 degrees. Due to such constitution, the formation of the pixel electrodes 18 by sputtering is improved thus enabling the formation of a film which exhibits high adhesiveness and high continuity.

The pixel separation layer 19 covers the end portions of the second reflective layers 17 and the pixel electrodes 18 thus preventing short-circuiting between the pixel electrode 18 and the common electrode 31 arranged on the organic light emission layer 30. Accordingly, it is preferable to set taper angles of end portions of the pixel separation layer 19 to 40 degrees or less. Further, the pixel separation layer 19 is configured to also cover exposed portions of the leveling layer 15 thus suppressing the diffusion of a gas discharged from the leveling layer 15 into the organic light emission layer 30. To ensure the above-mentioned gas-diffusion-prevention property, it is preferable to form the pixel separation layer 19 using a material having high electrical insulation and high moisture resistance such as SiO or SiN. However, the pixel separation layer 19 may be also formed using an organic insulation material such as polyimide or acryl. Further, since the pixel separation layer 19 is required to completely cover the edges of the first reflective layers 16, the second reflective layers 17 and the pixel electrodes 18, it is necessary to set a film thickness of the pixel separation layer 19 larger than a total thickness of the first reflective layer 16, the second reflective layer 17 and the pixel electrode 18.

Further, to prevent the gas discharged from the leveling layer 15 from being diffused into an interface between the pixel electrode 18 and the pixel separation layer 19 and from reaching the organic light emission layer 30, it is necessary to set the size 24 to 0.5 µm or more.

By adopting the above-mentioned structure, it is possible to seal a considerable quantity of the gas discharged from the leveling layer 15 and hence, the reliability of the organic EL display device can be enhanced.

What is claimed is:

1. An organic EL display device including a plurality of pixels, each pixel being constituted of a top-emission-type active matrix organic EL element, wherein
    the top-emission-type active matrix organic EL element comprises:
    a pixel electrode which is connected to an active element;
    a reflective layer arranged between the pixel electrode and an active element and is formed over a leveling layer;
    an organic light emission layer which is arranged on the pixel electrode; and
    a common electrode which is arranged on the organic light emission layer,
    the reflective layer comprises:
    a first reflective layer which is made of high-melting-point metal; and
    a second reflective layer which is arranged on the first reflective layer and is made of alloy containing aluminum, an aluminum compound or aluminum silicide, wherein the second reflective layer includes a planar pattern in which an outer periphery of the second reflective layer is surrounded by the first reflective layer, and wherein the pixel electrode extends outward from the first reflective layer and the second reflective layer.

2. An organic EL display device according to claim 1, wherein edges of the second reflective layer are forwardly tapered.

3. An organic EL display device according to claim 1, wherein the first reflective layer is made of Mo alloy or W alloy.

4. An organic EL display device according to claim 1, wherein the first reflective layer and the second reflective layer are covered with the pixel electrode made of ITO.

5. An organic EL display device according to claim 1, wherein edges of the first reflective layers, the second reflective layers and the pixel electrodes are covered with a pixel separation layer.

* * * * *